United States Patent
Ohuchi

(10) Patent No.: US 6,841,420 B2
(45) Date of Patent: Jan. 11, 2005

(54) SEMICONDUCTOR DEVICE AND METHOD OF MANUFACTURING THE SAME

(75) Inventor: Rieka Ohuchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/659,383

(22) Filed: Sep. 11, 2003

(65) Prior Publication Data

US 2004/0087062 A1 May 6, 2004

Related U.S. Application Data

(62) Division of application No. 10/384,744, filed on Mar. 11, 2003.

(30) Foreign Application Priority Data

Mar. 12, 2002 (JP) ........................................ 2002-066942

(51) Int. Cl.[7] .............................................. H01L 21/48
(52) U.S. Cl. ....................... 438/118; 438/112; 438/124; 438/126; 438/127
(58) Field of Search ............................. 438/118, 112, 438/124, 126, 127

(56) References Cited

U.S. PATENT DOCUMENTS 5,994,165 A  11/1999  Yoshino et al. ............. 438/106
6,627,997 B1 * 9/2003  Eguchi et al. ............... 257/777

FOREIGN PATENT DOCUMENTS

| JP | 5-144878 | 6/1993 |
|---|---|---|
| JP | 10-223686 | 8/1998 |
| JP | 2000-77472 | 3/2000 |

* cited by examiner

Primary Examiner—George Fourson
Assistant Examiner—Julio J. Maldonado
(74) Attorney, Agent, or Firm—Young & Thompson

(57) ABSTRACT

The present invention relates to a semiconductor device in which a semiconductor element and a substrate are disposed face-to-face, the mixture of the thermoplastic resin and the thermosetting resin is provided between the semiconductor element having the electrode formed thereon and the substrate having the wiring pattern formed thereon, the mixture holding in contact the electrode of the semiconductor element and the wiring pattern of the substrate. The semiconductor device of the present invention is obtained by: providing a sealing resin, which is a mixture of a thermoplastic resin and a thermosetting resin, between the semiconductor element and the substrate; heating at a temperature greater than a melting temperature of the thermoplastic resin; applying pressure to the sealing resin so that it spreads through the space between the semiconductor element and the substrate; melt-bonding the semiconductor element and the substrate through a cooling contraction of the thermoplastic resin component; and heating at a temperature less than a melt bond temperature of the thermoplastic resin component to cure the thermosetting resin component.

12 Claims, 4 Drawing Sheets

THERMOPLASTIC RESIN MELTS AND MAKES CONTACT (2 TO 3 SEC) HEAT OR ULTRASONICS

THERMOPLASTIC RESIN HARDENS AND FIXES CONTRACTION OF THERMOPLASTIC RESIN DUE TO COOLING + (CONTRACTION OF THERMOSETTING RESIN)

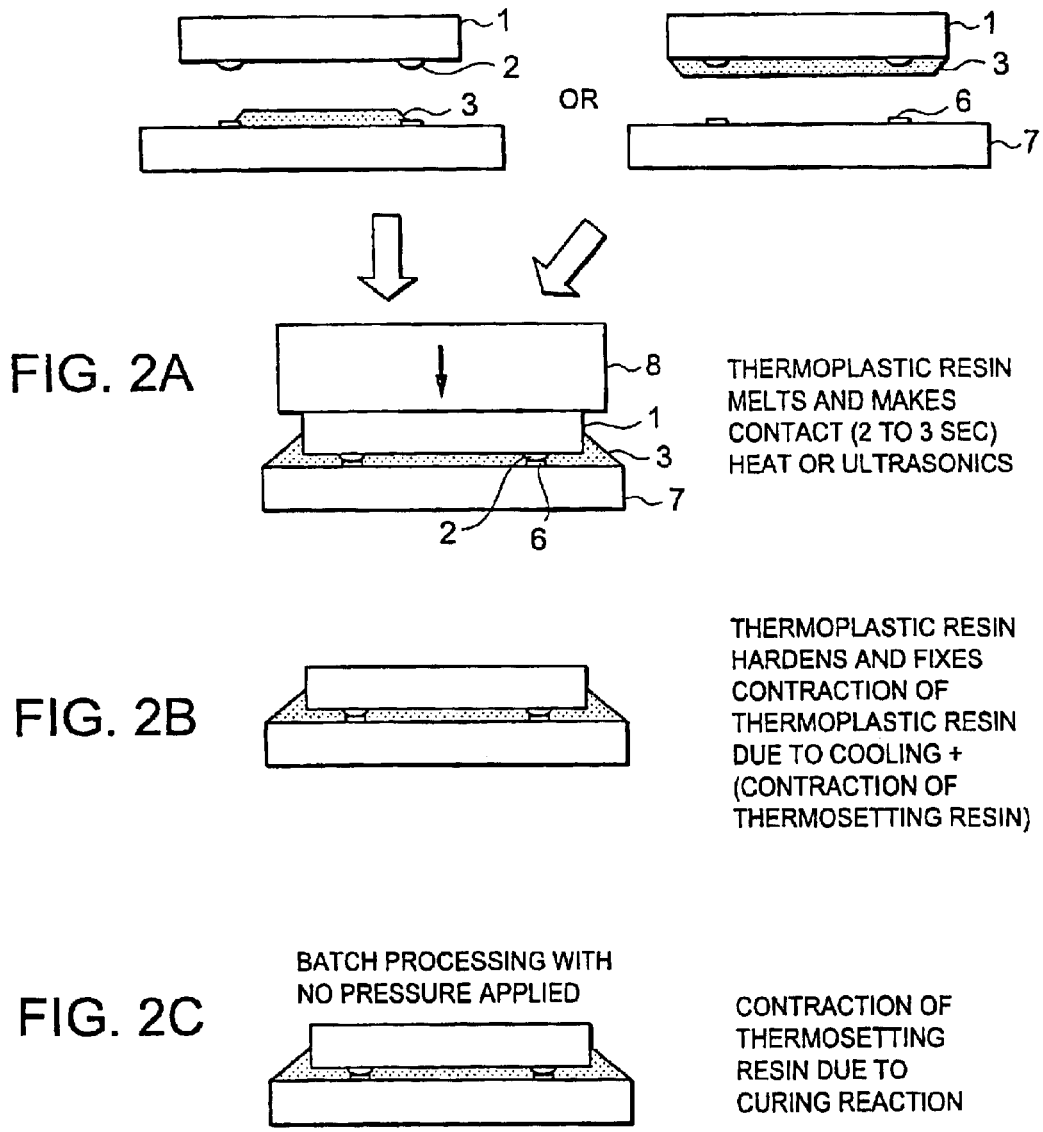

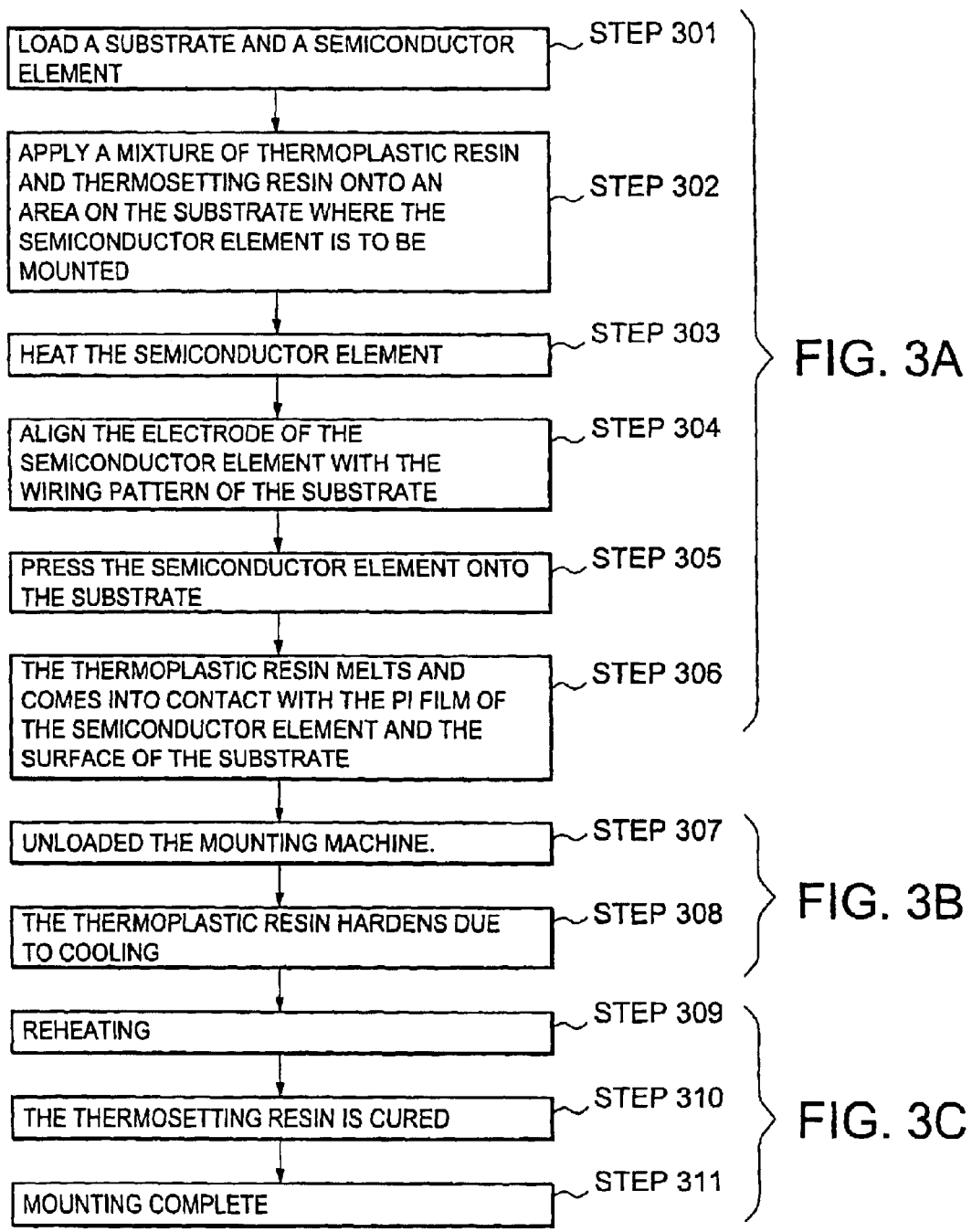

OPERATIONS ON THE MOUNTER

SEMICONDUCTOR DEVICE AND METHOD OF MANUFACTURING THE SAME

This application is a Divisional of U.S. patent application Ser. No. 10/384,744 filed on Mar. 11, 2003. The entire contents of the above-identified application are hereby incorporated by reference.

BACKGROUND OF THE INVENTION

1. Field of the Invention

The present invention relates to a semiconductor device in which connection between constituent parts is realized by an insulating resin for bonding and sealing, and to a production method thereof.

2. Description of the Related Art

There is known a method for mounting a semiconductor device, where electrical and mechanical connections between a semiconductor element and a substrate are realized by a holding power of a thermosetting insulating resin. As an example of such a method, steps of mounting a semiconductor element in Laid-Open Patent Application No. 10-223686 are illustrated in cross-section in FIGS. 1A and 1B. First, a substrate 17 and a semiconductor element 11 are loaded onto a mounting machine. Then, as shown in FIG. 1A, an insulating resin 13 for bonding and sealing (hereinafter, referred to as "sealing resin") is applied to the substrate 17 made of ceramic, glass, glass-epoxy, etc. on the side thereof where a wiring pattern 16 is provided.

The wiring pattern 16, which is made of Cr—Au, Al, Cu, ITO, etc., is formed by forming on the substrate 17 a metal layer by sputtering or vapor deposition, forming on the metal layer a resist having the wiring pattern 16 by a photo resist method, and etching the metal layer but the resist. The wiring pattern 16 may also be formed by printing or plating. The sealing resin 13 is a thermosetting resin such as epoxy resin, silicone resin, acrylic resin, etc.

Formed on an aluminum electrode of the semiconductor element 11 by electroplating, etc. is a protruding electrode 12 made of Au, Ag or Cu. The semiconductor element 11 is adsorptively held by a jig fixture 18 for pressing, heating and aligning purposes (hereinafter, referred to as "sealing jig fixture") on the side thereof opposite to where the protruding electrode 12 is formed.

Next, as shown FIG. 5B, while aligning the protruding electrode 12 of the semiconductor element 11 with the wiring pattern 16 by the sealing jig fixture 18, the semiconductor element 11 is pressed onto the substrate 17. When the protruding electrode 12 formed on the aluminum electrode of the semiconductor element 11 is pressed against the substrate 17, the thermosetting sealing resin 13 between the protruding electrode 12 and the wiring pattern 16 is forced out of the space therebetween, and the protruding electrode 12 and the wiring pattern 16 are electrically connected.

Then, while maintaining the pressure, the sealing resin 13 is cured by providing heat thereto from the sealing jig fixture 18. Later, the pressure is released, and the bonding of the semiconductor element 11 to the substrate 17 is completed. When this process is finished, the protruding electrode 12 of the semiconductor element 11 and the wiring pattern 16 of the substrate 17 are held together by the contractile force of the thermosetting sealing resin 13, thereby maintaining their electrical connection.

As described above, it has now been discovered that$_{13}$ in a conventional method of mounting the semiconductor element, where the liquid sealing resin is cured by providing heat while maintaining the pressure between the semiconductor element and the substrate by a sealing jig fixture, the pressure provided by the sealing fixture cannot be released until the curing of the thermosetting sealing resin is completed. Furthermore, although it is preferable that a sealing resin having a high glass transition temperature be used for better connection reliability, it generally takes more than 10 sec for such a thermosetting sealing resin to be cured, meaning that an expensive mounting machine is inevitably occupied for a long period of time and, therefore, the production cost cannot be reduced.

SUMMARY OF THE INVENTION

It is an object of the present invention to provide a semiconductor device and a production method thereof, in which time required to complete the mounting of a semiconductor element on a substrate can be shortened, thereby reducing a production cost.

A semiconductor device of the present invention is characterized in that the first constituent member having an electrode formed thereon and the second constituent member having an electrode formed thereon are disposed face-to-face, and that a mixture of a thermoplastic resin and a thermosetting resin is provided between the first constituent member having an electrode formed thereon and the second constituent member having an electrode formed thereon, the mixture holding in contact the electrode of the first constituent member and the electrode of the second constituent member. The present invention is also characterized in that the semiconductor element having an electrode formed thereon and the substrate having a wiring pattern formed thereon are disposed face-to-face, and that a mixture of a thermoplastic resin and a thermosetting resin is provided between the semiconductor element having an electrode formed thereon and the substrate having a wiring pattern formed thereon, the mixture holding in contact the electrode of the semiconductor element and the wiring pattern of the substrate. Furthermore, the present invention is characterized in that the melting temperature of the thermoplastic resin in the mixture is greater than the glass transition temperature of the thermosetting resin, and that the modulus of elasticity of the thermoplastic resin is less than the modulus of elasticity of the thermosetting resin. Moreover, the present invention is characterized in that $X \cdot E_1 \cdot \alpha_1 < (1-X) \cdot E_2 \alpha_2$ holds, where $E_1$ is the modulus of elasticity of the thermoplastic resin, $\alpha_1$ is the coefficient of thermal expansion of the thermoplastic resin, $E_2$ is the modulus of elasticity of the thermosetting resin, $\alpha_2$ is the coefficient of thermal expansion of the thermosetting resin, and X is the content by percentage of the thermoplastic resin in the mixture and $0<X<1$. It is preferable that the modulus of elasticity of the thermoplastic resin $E_1$ be less than the modulus of elasticity of the thermosetting resin $E_2$. It is also preferable that X be in the range from 0.4 to 0.6, that the thermoplastic resin be thermoplastic polyimide resin, and that the thermosetting resin be epoxy resin.

A method for producing a semiconductor device according to the present invention is characterized in that it includes steps of: providing a mixture of thermoplastic resin component and thermosetting resin component between the first constituent member and the second constituent member; heating at a temperature greater than the melting temperature of the thermoplastic resin component; applying pressure to the mixture so that it spreads through the space between the first constituent member and the second constituent member; completing the melt bonding of the first constituent member and the second constituent member through cooling contraction of the thermoplastic resin component; and heating at a temperature less than the melt bond temperature of the thermoplastic resin component to cure the thermosetting resin component. A method for producing a semiconductor device according to the present invention is also characterized in that it includes steps of: providing a mixture of thermoplastic resin component and thermosetting resin component between the semiconductor element and the substrate; heating at a temperature greater than the melting temperature of the thermoplastic resin component; applying pressure to the mixture so that it spreads through the space between the semiconductor element and the substrate; completing the melt bonding of the semiconductor element and the substrate through cooling contraction of the thermoplastic resin component; and heating at a temperature less than the melt bond temperature of the thermoplastic resin component to cure the thermosetting resin component.

Conventionally, since a liquid thermosetting resin alone was used as the sealing resin, the mounting machine must remains in the state of being loaded with a semiconductor element to be mounted until the thermosetting resin is cured in order to obtain a firm press bonding. In the present invention, melt bonding due to the thermoplastic resin component constituting a sealing material is utilized in the mounting of a semiconductor element. The thermoplastic resin component in a mixture, which melts upon heating and being pressurized and spreads through the space between the semiconductor element and the substrate, is cooled down quickly when a heat source is removed, thereby reducing time required for mounting a semiconductor element. When this is being done, a thermal contractile force of the resin due to cooling acts between the semiconductor element and the substrate, and the electrode of the semiconductor element and the wiring pattern of the substrate are held together in electrical connection. Then, the thermosetting resin component constituting the mixture is cured. Here, the curing temperature of the thermosetting resin component is chosen to be less than the melting temperature of the thermoplastic resin component. Therefore, reheating up to the curing temperature does not completely nullify the thermal contractile force due to the thermoplastic resin component, and the state of pressure bond between the electrode of the semiconductor element and the wiring pattern of the substrate is maintained. When the thermosetting resin component is cured, a contractile force due to the curing of the thermosetting resin component comes into play, further enhancing the connection reliability.

BRIEF DESCRIPTION OF THE DRAWINGS

The above and other objects, advantages and features of the present invention will be more apparent from the following description taken in conjunction with the accompanying drawings, in which:

FIGS. 2A, 2B and 2C are cross-sectional views illustrating the steps for producing a semiconductor device of the present invention in a step-wise manner;

FIG. 3A to 3C are flow-chart describing the steps for producing a semiconductor device of the present invention;

DETAILED DESCRIPTION OF THE PREFERRED EMBODIMENTS

Figure 1A:
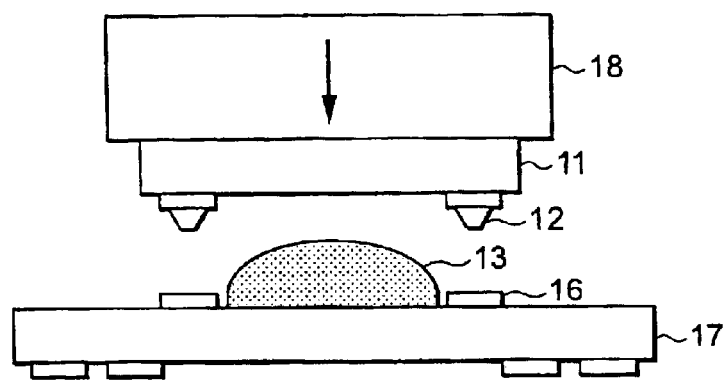
FIGS. 1A and 1B are cross-sectional views illustrating the steps for mounting a semiconductor element in a prior art.
Figure 1B:
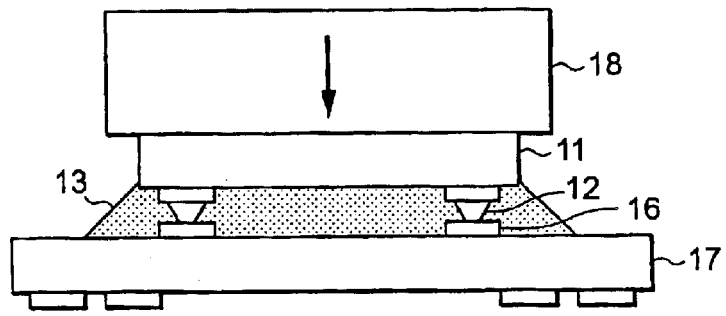

The invention will be now described herein with reference to illustrative embodiment. Those skilled in the art will recognize that many alternative embodiments can be accomplished using the teachings of the present invention and that the invention is not limited to the embodiment illustrated for explanatory purposes.

Preferred embodiment of the present invention will be described with reference to FIGS. 2A to 2C and 3. FIGS. 2A to 2C are cross-sectional views illustrating the steps of producing a semiconductor device of the present invention in a step-wise manner, and FIG. 3 is a flow-chart describing the production steps of FIGS. 2A to 2C.

A semiconductor device in this embodiment and a mounting method therefor will be described as follows. First, as shown in FIG. 2A, a substrate 7 and a semiconductor element 1 are loaded onto a mounting machine (step 301). Here, the substrate 7 is made of ceramic, glass, glass-epoxy, etc., and formed thereon is a wiring pattern 6 made of Cr—Au, Al, Cu, ITO, etc. by forming on the substrate 7 a metal layer by sputtering or vapor deposition, forming on the metal layer a resist having the wiring pattern 6 by a photo resist method, and etching the metal layer but the resist. The wiring pattern 6 may also be formed by printing or plating.

Formed on an aluminum electrode of the semiconductor element 1 is a protruding electrode 2 made of Au, Ag or Cu and having a pointed shape by electroplating or ball bonding. The semiconductor element 1 is adsorptively held on the surface thereof opposite to where the protruding electrode 2 is formed by a sealing jig fixture 8.

Next, a sealing resin 3, which is a mixture of a thermoplastic resin and a thermosetting resin, is provided onto an area on the substrate 7 where the semiconductor element 1 is to be mounted (step 302). The sealing resin is appropriately selected while taking into consideration the flowability during heating, mechanical properties after the curing, thermal properties, etc. Preparation of a mixture as a sealing resin is not limited to any particular manner, and it can be prepared, for example, by first dissolving thermoplastic resin components into a solvent and uniformly dispersing liquid thermosetting resin components thereinto and then removing excess solvent. Here, as a preferable example, the thermoplastic resin component is chosen to be silicone-denatured polyimide, which is one of thermoplastic polyimides having high heat resistance (glass transition temperature is about 230° C.; melting temperature is 280 to 300° C.), and the thermosetting resin component is chosen to be acid anhydride epoxy which is one of epoxy resins (glass transition temperature is about 150° C.). The sealing resin 3 may be liquid or in the form of a sheet so long as it melts at a pressure bonding temperature and hardens at the cooling thereafter. The sealing resin 3 may be provided to the semiconductor element 1 beforehand.

Next, the heating of the semiconductor element 1 by the sealing jig fixture 8 is started (step 303).

Next, the sealing jig fixture 8 is brought into motion in such a manner that the protruding electrode 2 of the semiconductor element 1 is aligned with the wiring pattern 6 of the substrate 7 (step 304), and the semiconductor element 1 is pressed against the substrate 7 as indicated by an arrow in the figure (step 305). When this is being done, the thermoplastic resin component of the sealing resin 3 not only melt but is forced out of the space between the substrate 7 and the semiconductor element 1 while the protruding electrode 2 formed on the aluminum electrode of the semiconductor element 1 and having a pointed shape is making sufficient contact with the wiring pattern 6 of the substrate 7. By bringing the sealing jig fixture 8 away from the semiconductor element 1, the melted thermoplastic resin component is cooled quickly and hardened, thereby securing the electrical connection (step 306). Incidentally, a time interval during which the heating by the sealing jig fixture 8 is halted may be provided just before the end of the pressing cycle. In that case, the sealing jig fixture 8 can be brought away from the semiconductor element 1 while the thermoplastic resin component is already in the state of having been cooled, thereby enhancing the connection reliability. As described here, the electrode of the semiconductor element and the wiring pattern of the substrate are fixed to each other with the sealing resin with their positions being properly aligned to each other. The electrical connection between the electrode of the semiconductor element and the wiring pattern of the substrate is realized by maintaining the physical contact therebetween by a holding power of the sealing resin, with the semiconductor element and the substrate being mechanically connected with the sealing resin.

In the case where the thermoplastic resin component is silicone denatured polyimide, the heating by the sealing jig fixture 8 is conducted at a temperature above 280 to 300° C. (melting temperature) and below that which does not damage the semiconductor element 1 and the substrate 7 for a period of 2 to 10 sec, or preferably 2 to 5 sec, or more preferably 2 to 3 sec. Then, if the sealing jig fixture 8 is brought away from the semiconductor element 1, the sealing resin 3 is naturally cooled down below the melting temperature, and the thermoplastic resin component is hardened. During this cycle, the thermosetting resin component, which is mixed in the sealing resin, is not cured for the reasons that the heating period is short, that the thermoplastic resin is present, etc. and other curing inhibiting factors.

Next, as shown in FIG. 2B, the semiconductor element 1 and the substrate 7, which are fixed to each other with the sealing resin 3, are unloaded from the mounting machine (step 307). When this is being done, the sealing resin 3, which exists between the semiconductor element 1 and the substrate 7 and has been cooled to a room temperature holds together the protruding electrode 2 and the wiring pattern 6 of the substrate 7 by thermal contraction (step 308). The force of thermal contraction, which is in the direction of thickness and holds together the protruding electrode 2 and the wiring pattern 6, is expressed as $\Delta T \times \alpha \times E$, where typical values for $\alpha$ and E are 60 to 120 ppm and 1 to 10 Gpa, respectively, in the case of silicone-denatured polyimide. Here, an example is given of a sealing resin where the volume ratio of silicone-denatured polyimide which is in a solid state at room temperature to thermosetting resin which is in a liquid state at room temperature is 1 to 1, that is, a content by percentage of silicone denatured polyimide, X, is 0.5. In the case of silicone denatured polyamide, where $\alpha = 120$ ppm and $E = 1$ GPa, if $\Delta T = $(glass transition temperature)$-$(room temperature)$= 230-25 = 215°$ C., then the initial contractile force due to the silicone-denatured polyamide becomes $X \times \alpha T \times \alpha \times E = 12.9$ MPa. Here, since the curing of the thermosetting resin component hardly proceeds if the heating ends in a short period of time, its contribution to the initial contractile force is negligible, and it is excluded from consideration. Moreover, even if the thermosetting resin component is in the state of solid, it is in the uncured state and its modulus of elasticity is small, hardly contributing to the contractile force.

Next, as shown in FIG. 2C, the semiconductor element 1 and the substrate 7 which are fixed to each other with the sealing resin 3 are reheated (step 309) to cure the thermosetting resin. In the present embodiment, since a thermosetting resin whose glass transition temperature, one of the post-curing characteristics; is 150° C. has been chosen, the reheating is conducted at 150° C. During this reheating cycle, the temperature of the whole resin rises to 150° C., and the initial contractile force of the thermoplastic resin component decreases by 7.5 MPa, or specifically, it becomes 12.9 MPa$-$7.5 MPa$=5.4$ MPa. This is the thermal contractile force due to the thermoplastic resin component of the sealing resin 3, which holds together the protruding electrode 2 and the wiring pattern 6 of the substrate 7. Therefore, the thermosetting resin component of the sealing resin 3 is cured with the protruding electrode 2 and the wiring pattern 6 being electrically connected (step 310).

The contractile force due to the curing reaction of the thermosetting resin component adds to 5.4 MPa, which is the contractile force due to the thermoplastic resin component at the temperature of 150° C. After the curing, the sealing resin is cooled to room temperature. When this is being done, if acid anhydride epoxy has been chosen to be the thermosetting resin component, then $E = 4$ Gpa and $\alpha = 60$ ppm, and a contractile force given by $(1-X) \times \Delta T \times \alpha \times E = 15$ MPa results through the thermo-contraction of the thermosetting resin component due to cooling. This contractile force holds together the protruding electrode 2 and the wiring pattern 6 more firmly, thereby enhancing the connection reliability (step 311).

Incidentally, depending on the deformation property of the substrate 7, the pressure applied during heating may be maintained until either before or after the fall of the temperature so long as it does not induce any deformation.

The relationship between the characteristic values of thermoplastic resin and thermosetting resin is:

(Melting temperature of thermoplastic resin)>(Glass transition temperature of thermosetting resin); and $$X \cdot E_1 \cdot \alpha_1 < (1-X) \cdot E_2 \cdot \alpha_2.$$

Here, $E_1$ is a modulus of elasticity of thermoplastic resin, $\alpha_1$ is a coefficient of thermal expansion of thermoplastic resin, $E_2$ is a modulus of elasticity of thermosetting resin, $\alpha_2$ is a coefficient of thermal expansion of thermosetting resin, and X is a content by percentage of the thermoplastic resin in the mixture with $0<X<1$. By setting the contractile force of the thermosetting resin component, which is cured in the latter steps, to be greater than that of thermoplastic resin component, high connection reliability can be obtained. Considering the process stability and the connection reliability, it is preferable that X be in the range from 0.4 to 0.6.

Moreover, it is still more preferable that $E_1 < E_2$ holds.

Figure 4:
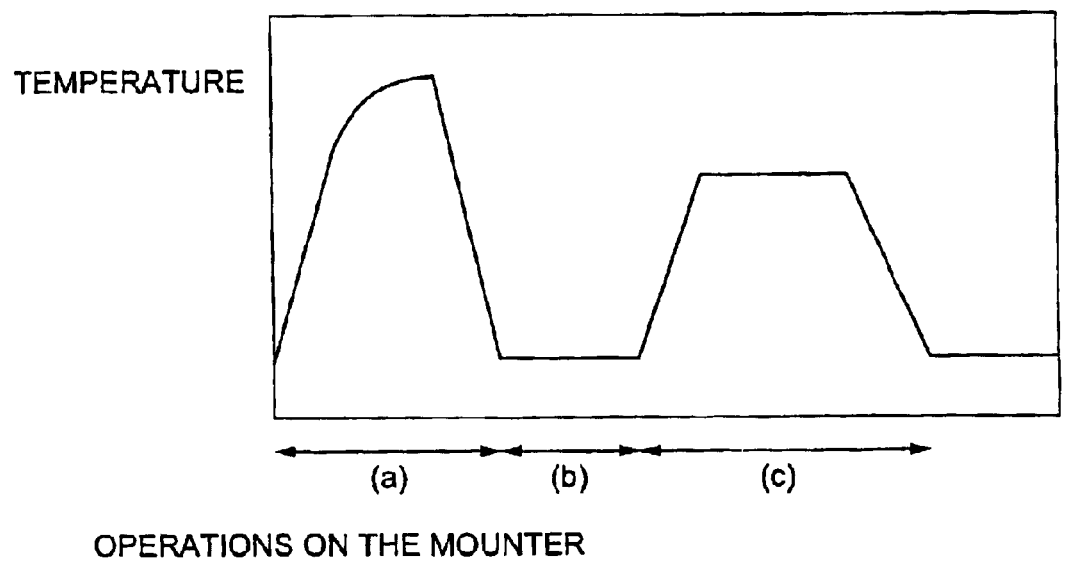
FIG. 4 is a graph illustrating the change of heating temperature during the production of a semiconductor device of the present invention.
Figure 5:
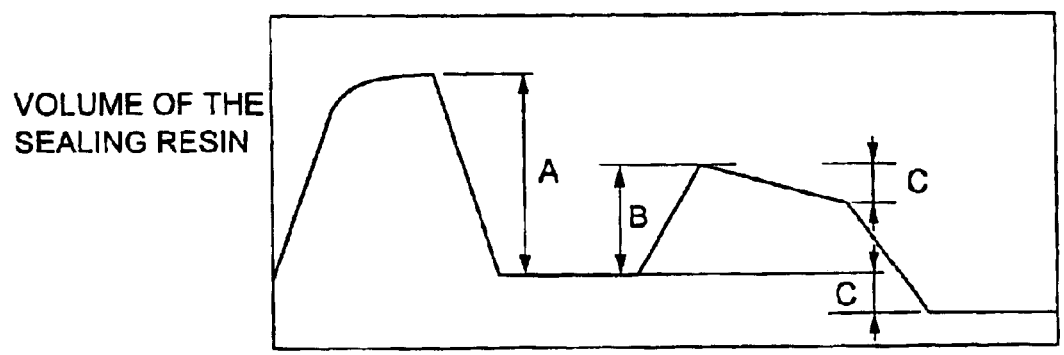
FIG. 5 is a graph illustrating the change of volume of the sealing resin during the production of a semiconductor device of the present invention.

FIG. 4 illustrates the change of heating temperature during the steps shown in FIGS. 2A to 2C, and FIG. 5 illustrates the change of volume of the sealing resin.

The sealing resin decreases in volume (corresponding to A in FIG. 5) during the final cooling process indicated by the interval (a) in FIG. 4 where melted resin is cooled and hardened, and the resulting contractile force of the sealing resin holds the electrode of the semiconductor element and the wiring pattern of the substrate in connection. Next, the reheating is conducted until the curing temperature is reached so that the thermosetting resin component in the sealing resin is cured. Although the volume of the sealing resin increases (corresponding to B in FIG. 5) during this reheating, the reheating temperature is chosen to be lower than the melt bond temperature. Therefore, this volume increase does not cancel or go beyond the contraction due to the cooling process therebefore, and the protruding electrode and the wiring pattern stay in connection. Then, by heating the thermosetting resin component for a prescribed duration, the thermosetting resin component is cured and contracted (corresponding to C in FIG. 5). The sealing resin decreases in volume once again when cooled down to room temperature after the thermosetting resin component is cured. That is, a contact force between the protruding electrode and the wiring pattern is strengthened more than at the time of placement of the semiconductor element by an amount of contraction of the thermosetting resin (corresponding to C in FIG. 5), thereby enhancing the sealing reliability.

Although, in the embodiment of the present invention described above, the connection of a semiconductor element to a substrate was described, it is clear that this invention is not limited to that case but may be equally applied to the connection between other constituent parts.

As described above, the present invention can be utilized to reduce time during which the mounting machine is loaded with a semiconductor element. Accordingly, the output of the expensive mounting machine can be improved, and the cost of production can be reduced. Moreover, since the placement of the semiconductor element is conducted only by the melt bonding of thermoplastic resin component, time required for the placement of the semiconductor element can be shortened. Since thermosetting resin component is cured at a temperature lower than the melt bond temperature of thermoplastic resin component, the thermoplastic resin making a melt bonding expands during reheating. However, by choosing the reheating temperature to be lower than the melt bond temperature, this volume increase does not cancel or go beyond the contraction due to the cooling process therebefore. Hence, the protruding electrode and the wiring pattern stay in connection, and the contact force between the protruding electrode and the wiring pattern is strengthened more than at the time of placement of the semiconductor element by an amount of contraction of the thermosetting resin, thereby enhancing the sealing reliability. By choosing a modulus of elasticity of the thermosetting component to be higher than that of the thermoplastic component, the contact force between the protruding electrode and the wiring pattern does not weaken even if they are heated after the curing.

It is apparent that the present invention is not limited to the above embodiment, but may be modified and changed without departing from the spirit and scope of the invention except as defined in the appended claims.

What is claimed is:

1. A method for producing a semiconductor device comprising steps of:
    providing a mixture of thermoplastic resin component and thermosetting resin component between constituent parts;
    heating at a temperature greater than a melting temperature of said thermoplastic resin component;
    applying pressure to said mixture so that it spreads through a space between said constituent parts;
    completing a melt bonding of said constituent parts through a cooling contraction of said thermoplastic resin component; and
    heating at a temperature less than a melt bond temperature of said thermoplastic resin component to cure said thermosetting resin component.

2. A method for producing a semiconductor device comprising steps of:
    providing a mixture of thermoplastic resin component and thermosetting resin component between a semiconductor element and a substrate;
    heating at a temperature greater than a melting temperature of said thermoplastic resin component;
    applying pressure to said mixture so that it spreads through a space between said semiconductor element and said substrate;
    completing a melt bonding of said semiconductor element and said substrate through a cooling contraction of said thermoplastic resin component; and
    heating at a temperature less than a melt bond temperature of said thermoplastic resin component to cure said thermosetting resin component.

3. A method for producing a semiconductor device according to claim 1, wherein
    a melting temperature of said thermoplastic resin is greater than a glass transition temperature of said thermosetting resin.

4. A method for producing a semiconductor device according to claim 2, wherein
    a melting temperature of said thermoplastic resin is greater than a glass transition temperature of said thermosetting resin.

5. A method for producing a semiconductor device according to claim 3, wherein
    $X \cdot E_1 \cdot \alpha_1 < (1-X) \cdot E_2 \cdot \alpha_2$ holds, where
    $E_1$ is a modulus of elasticity of said thermoplastic resin,
    $\alpha_1$ is a coefficient of thermal expansion of said thermoplastic resin,
    $E_2$ is a modulus of elasticity of said thermosetting resin,
    $\alpha_2$ is a coefficient of thermal expansion of said thermosetting resin, and
    X is a content by percentage of said thermoplastic resin in said mixture and $0<X<1$.

6. A method for producing a semiconductor device according to claim 4, wherein
    $X \cdot E_1 \cdot \alpha_1 < (1-X) \cdot E_2 \cdot \alpha_2$ holds, where
    $E_1$ is a modulus of elasticity of said thermoplastic resin,
    $\alpha_1$ is a coefficient of thermal expansion of said thermoplastic resin,
    $E_2$ is a modulus of elasticity of said thermosetting resin,
    $\alpha_2$ is a coefficient of thermal expansion of said thermosetting resin, and
    X is a content by percentage of said thermoplastic resin in said mixture and $0<X<1$.

7. A method for producing a semiconductor device according to claim 5, wherein
    the modulus of elasticity $E_1$ of said thermoplastic resin is less than the modulus of elasticity $E_2$ of said thermosetting resin.

8. A method for producing a semiconductor device according to claim 6, wherein
    the modulus of elasticity $E_1$ of said thermoplastic resin is less than the modulus of elasticity $E_2$ of said thermosetting resin.

9. A method for producing a semiconductor device according to claim 5, wherein
    said X is in a range from 0.4 to 0.6.

10. A method for producing a semiconductor device according to claim 6, wherein
said X is in a range from 0.4 to 0.6.

11. A method for producing a semiconductor device according to claim 1, wherein
said thermoplastic resin is thermoplastic polyimide resin and said thermosetting resin is epoxy resin.

12. A method for producing a semiconductor device according to claim 2, wherein
said thermoplastic resin is thermoplastic polyimide resin and said thermosetting resin is epoxy resin.

* * * * *